United States Patent
Cirelli et al.

(10) Patent No.: US 6,218,057 B1
(45) Date of Patent: Apr. 17, 2001

(54) LITHOGRAPHIC PROCESS HAVING SUB-WAVELENGTH RESOLUTION

(75) Inventors: Raymond Andrew Cirelli, Hillsborough; Omkaram Nalamasu, Bridgewater; Stanley Pau, North Plainfield; George Patrick Watson, Avon, all of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/293,103

(22) Filed: Apr. 16, 1999

(51) Int. Cl.$^7$ .................................................... G03F 9/00
(52) U.S. Cl. .................................................................. 430/5
(58) Field of Search ................................ 430/5, 322, 324, 430/394

(56) References Cited

U.S. PATENT DOCUMENTS

| | | | |
|---|---|---|---|
| 4,937,619 | 6/1990 | Fukuda et al. | 355/53 |
| 5,138,176 | 8/1992 | Nishi | 250/548 |
| 5,308,741 | 5/1994 | Kemp | 430/312 |
| 5,476,736 | * 12/1995 | Tanabe | 430/5 |
| 5,667,918 | 9/1997 | Brainerd et al. | 430/5 |
| 5,717,518 | 2/1998 | Shafer et al. | 359/357 |
| 5,807,649 | 9/1998 | Liebmann et al. | 430/5 |
| 5,821,014 | 10/1998 | Chen et al. | 430/5 |
| 5,837,557 | 11/1998 | Fulford, Jr. et al. | 438/6 |
| 5,853,923 | * 12/1998 | Tzu | 430/5 |
| 6,048,649 | * 4/2000 | Burke et al. | 430/5 |

OTHER PUBLICATIONS

Kamon et al., *J. Vac. Sci. Technol. B*, "Experimental and Simulated Esimation of New Super Resolution Technique", vol. 14(6), pp. 4171–4174, Nov./Dec. 1996.

Kamon et al., *Jpn. J. Appl. Phys.*, "Proposal of a Next–Generation Super Resolution Technique", vol. 33, No. 12B, pp. 6848–6854, Dec. 1994.

Matsumoto et al., *SPIE*, "Innovative Image Formation: Coherency Controlled Imaging", vol. 2197, pp. 844–853.

Moreau, *Semiconductor Lithography Principles, Practices, and Materials*, Plenum Press, "Additive Process", pp. 567–630, 1988.

* cited by examiner

*Primary Examiner*—S. Rosasco
(74) *Attorney, Agent, or Firm*—Richard J. Botos

(57) ABSTRACT

A lithographic process for making an article such as a semiconductor device or a lithographic mask is disclosed. In the process, articles are fabricated by a sequence of steps in which materials are deposited on a substrate and patterned. These patterned layers are used to form devices on the semiconductor substrate. The desired pattern is formed by introducing an image of a first pattern in a layer of energy sensitive material. The image is then developed to form a first pattern. A layer of energy sensitive material is then formed over the first pattern. An image of a second pattern is then formed in the layer of energy sensitive material formed over the first pattern. The second pattern is then developed. The desired pattern is then developed from the first pattern and the second pattern.

12 Claims, 4 Drawing Sheets

LITHOGRAPHIC PROCESS HAVING SUB-WAVELENGTH RESOLUTION

BACKGROUND OF THE INVENTION

1. Technical Field

The present invention is directed to lithographic processes for device and mask fabrication and, in particular, to resolution enhancement techniques for such processes.

2. Art Background

In lithographic processes for device fabrication, radiation is typically projected onto a patterned mask (also referred to as a reticle) and the radiation transmitted through the mask is further transmitted onto an energy sensitive material formed on a substrate. Transmitting the radiation through a patterned mask patterns the radiation itself and an image of the pattern is introduced into the energy sensitive material when the energy sensitive resist material is exposed to the patterned radiation. The image is then developed in the energy sensitive resist material and transferred into the underlying substrate. An integrated circuit device is fabricated using a series of such exposures to pattern different layers of material formed on a semiconductor substrate.

An integrated circuit device consists of a very large number of individual devices and interconnections therefore. Configuration and dimensions vary among the individual devices. The pattern density, (i.e. the number of pattern features per unit area of the pattern) also varies. The patterns that define integrated circuit devices are therefore extremely complex and non-uniform.

As the complexity and density of the patterns increase, so does the need to increase the accuracy of the lithographic tools that are used to create the patterns. The accuracy of lithographic tools is described in terms of pattern resolution. The better the resolution, the closer the correspondence between the mask patterns and the pattern that is created by the tool. A number of techniques have been used to enhance the pattern resolution provided by lithographic tools. The most prevalent technique is the use of shorter wavelength radiation. However, this technique is no longer viable when exposure wavelengths are in the deep ultraviolet (e.g., 248 nm, 193 nm and 157 nm) range. Using wavelengths below 193 nm to improve resolution is presently not economically and technologically feasible because the materials used for lenses in optical lithography cameras absorb this shorter wavelength radiation.

Resolution enhancement techniques (RET) other than simply using shorter wavelength radiation have been proposed. These techniques use exotic illumination from the condenser (e.g. quadrupole illumination), pupil filters, phase masks, optical proximity correction, and combinations of these techniques to obtain greater resolution from an existing camera. However, such techniques typically improve resolution only for some of the individual features of a pattern. The features for which resolution is improved are identified as the critical features. The resolution of many other features is either not improved or actually degraded by such resolution enhancement techniques. Thus, current RETs require a compromise between resolution enhancement for the critical features and resolution degradation for the non-critical features. Such compromises usually require sub-optimal illumination of the critical features in order to avoid significant degradation in the illumination of the non-critical features.

Resolution enhancement techniques have been proposed to customize mask feature illumination in projection lithography for the various different features in the mask. One such technique is described in Matsumoto, K., et al., "Innovative Image Formation: Coherency Controlled Imaging," *SPIE*, Vol. 2197, p. 844 (1994). That technique employs an additional mask and additional lens to customize the radiation incident on each feature of the mask. A similar system is described in Kamon, K., "Proposal of a Next-Generation Super Resolution Technique," Jpn. *J. Appl. Phys.*, Vol. 33, Part 1, No. 12B, p. 6848 (1994).

In the resolution enhancement techniques described in Matsumoto et al. and Kamon et al., the first mask has features that are identical to the features on the second mask. The features on the first mask diffract the radiation incident on the mask, and the diffracted radiation illuminates the identical feature on a second mask. For example, radiation transmitted through a grating pattern on the first mask is projected onto an identical grating pattern on the second mask. Similarly, radiation transmitted through an isolated line on the first mask is projected onto an identical isolated line on the second mask. When the diffracted energy from the first mask illuminates the identical feature on the second mask, the resulting image is often superior to an image obtained from quadrupole illumination of the pattern. Therefore, this resolution enhancement technique provides an improvement in aerial image contrast (i.e. the image in the focus plane of the projection lens) over conventional off-axis illumination using the quadrupole system.

The above-described resolution enhancement technique provides customized illumination for more features than quadrupole illumination. However, the above-described technique does not improve the resolution of all features in the pattern. Furthermore, the two-mask system is costly and complex. Specifically, the system requires two precisely patterned masks instead of one. The corresponding features on the first and second masks must match precisely. The alignment of the first and second masks is also critical. Furthermore, the technique is limited because the features on the first mask are illuminated uniformly. Thus, the problems associated with non-customized illumination of a patterned mask are not eliminated by this system, but simply stepped further back into the optics of the system. Therefore, resolution enhancement techniques that improve the resolution of all features and are cheaper and easier to implement are sought.

SUMMARY OF THE INVENTION

The present invention is directed to a lithographic process with sub-wavelength resolution. The lithographic process is used for device fabrication or for mask fabrication. In the present invention, an image of a pattern is introduced into an energy sensitive resist material by projecting radiation through a first mask feature which defines an image of a first pattern. The radiation is light of a particular wavelength (e.g. 248 nm, 193 nm, etc.). Radiation also includes electron beam or ion beam radiation. That first pattern is then developed and, in certain embodiments, transferred into the underlying substrate. This first pattern is referred to as an intermediate feature. The intermediate feature has dimensions that are typically, greater than or approximately equal to the wavelength of the radiation that is used to transfer the image of the first mask feature into the energy sensitive resist material. It is advantageous for the intermediate feature to have dimensions greater than or equal to the wavelength of the exposing radiation because the images from which the features are created are easier to resolve than images with sub-wavelength size dimensions. Also, creating images of features having dimensions greater than or equal to the wavelength of exposing radiation requires less proximity effect correction and suffers from fewer adverse diffraction effects compared to creating images of features with sub-wavelength dimensions. Adverse diffraction effects include a loss of contrast, a loss of intensity, adverse proximity effects, etc.

A layer of energy sensitive material is then formed over substrate having the intermediate feature. An image of a pattern is then introduced into the energy sensitive resist material by projecting radiation through a second mask feature which defines a second image. The radiation used for the second exposure does not have to have the same wavelength as the radiation used for the first exposure. This second image is developed into a second pattern, which is referred to as a second intermediate feature. The second intermediate feature has dimensions that are greater than or approximately equal to the wavelength of the radiation that is used to introduce the second image into the resist material. The advantages that derive from forming intermediate features with dimensions larger than or equal to the wavelength of the exposing radiation are as previously described. The first mask feature and the second mask feature cooperate to define a desired pattern feature. The desired pattern feature is defined by the first intermediate feature created from the first mask feature and the second intermediate feature created from the second mask feature. In one embodiment, the first intermediate feature and the second intermediate feature define the pattern feature, which is transferred into the underlying substrate. In another embodiment, the pattern feature is defined by the overlap between the first intermediate feature and the second intermediate feature. In this embodiment, the pattern feature is formed by selectively removing the non-overlapping portions of the first intermediate feature and the second intermediate feature.

DETAILED DESCRIPTION

Figure 1:
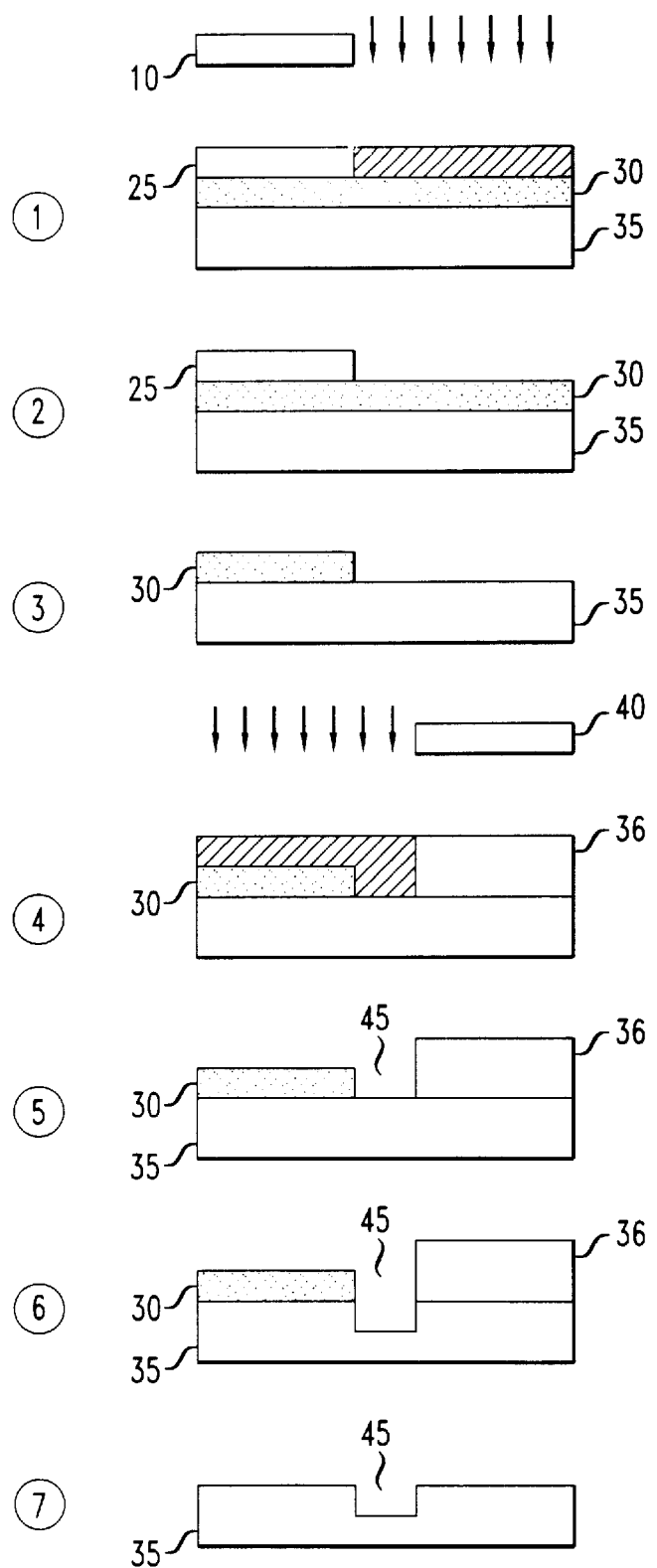
FIG. 1 is a schematic illustration of one process sequence of the present invention.

Referring to FIG. 1, radiation 20 is patterned by mask 10 in step 1. The patterned radiation introduces an image of the mask 10 into a layer of energy-sensitive photoresist 25. In step 2, the image in layer 25 is developed to form a photoresist mask. In step 3, the photoresist mask pattern is then etched into the underlying layer of hard mask material 30, formed on a silicon substrate 35. Conventional hard mask materials, such as oxidized silicon, silicon nitride and spin-on glass, are contemplated as suitable. A layer of energy-sensitive photoresist 36 is then formed over the patterned layer of hard mask material. In step 4, an image of mask 40 is then introduced into the photoresist 36. The image of mask 40 overlaps with the patterned layer of hard mask material 30. In step 5, the image is then developed to obtain a patterned resist layer 36. The resulting structure has a first patterned hard mask 30 and a second patterned resist layer 36 formed on the substrate 35. These two patterned layers together define a feature 45, which has a dimension smaller than the wavelength of the exposing radiation. In step 6, the patterned layers 30 and 36 are used to transfer the feature 45 into the underlying substrate 35. Conventional etch expedients are contemplated as suitable for this purpose. In step 7, the patterned layers 30 and 36 are removed from the substrate 35 with feature 45 etched therein.

Figure 2:
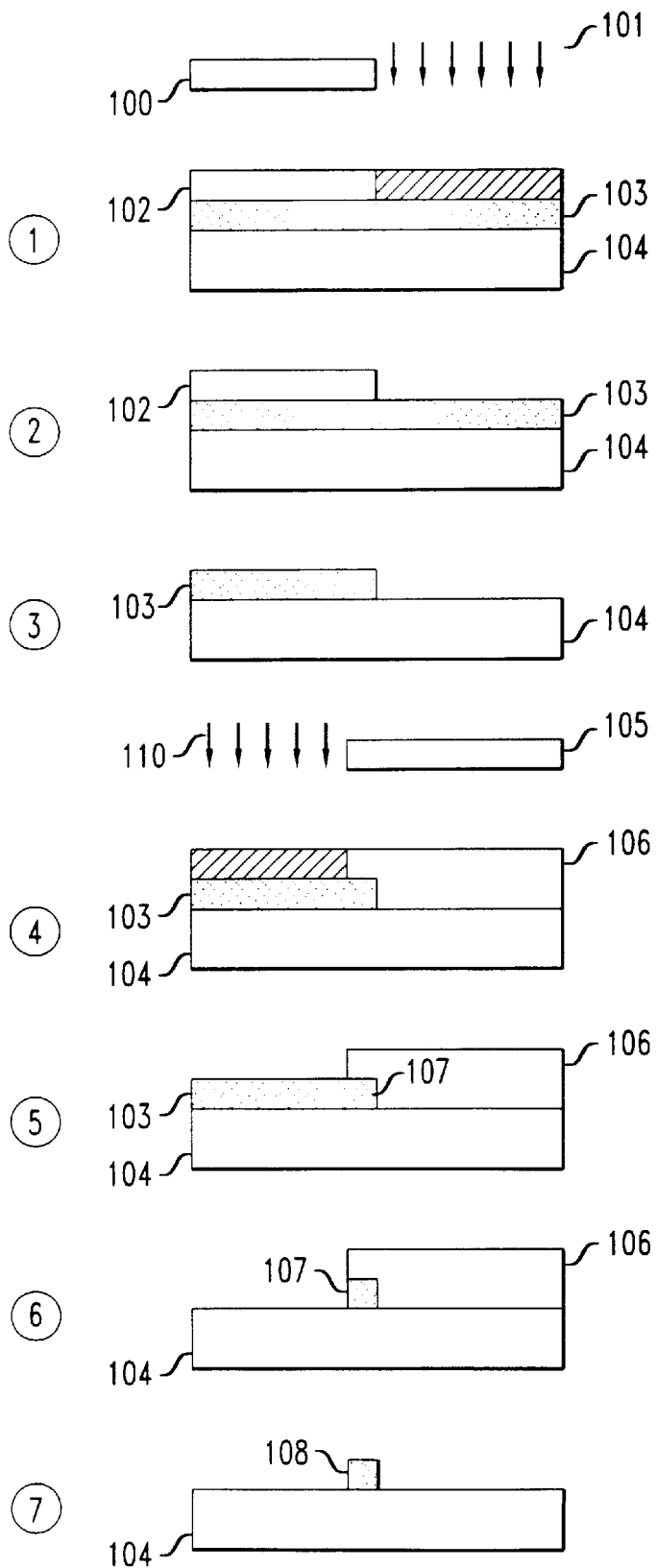
FIG. 2 is a schematic illustration of a second process sequence of the present invention.

Referring to FIG. 2, radiation 101 is projected through a mask 100 in step 1. The radiation introduces an image of a pattern in energy sensitive resist layer 102, which is formed over a layer of hard mask material 103, which is formed on a silicon substrate 104. Since, in this process sequence, the feature is formed in the hard mask material layer, the hard mask material is either a dielectric material (e.g. oxidized silicon, silicon nitride) or a metal. It is advantageous if the hard mask material is a dielectric material because of the contamination issues associated with the use of metals as masking layers. In step 2, the pattern is then developed in energy sensitive resist layer 102. In step 3, the pattern is transferred from resist layer 102 and into the layer of hard mask material 103. A layer of energy sensitive material is then formed on the resulting structure. In step 4, radiation 10 is projected through mask 105 and the patterned radiation introduces an image of a pattern in energy sensitive resist layer 106. In step 5, the pattern is then developed in energy sensitive resist layer 106. Note that a portion of the developed resist layer 106 overlies a portion of the patterned hard mask 103. This region of overlap 107 is the desired pattern. In step 6, the portion of the patterned hard mask layer that is not covered by the developed resist layer 106 is removed. In step 7, the developed resist layer 106 is removed and the feature 108 that results is the portion of the patterned hard mask layer that was in the region of overlap 107. Again, although the dimensions of the patterns developed in steps 3 and 5 are greater than the wavelength of the exposing radiation, the dimensions of the feature 108 are less than the wavelength of the exposing radiation. It is in this manner that the process of the present invention is used to fabricate features that have a dimension smaller than the wavelength of the exposing radiation.

Figure 3:
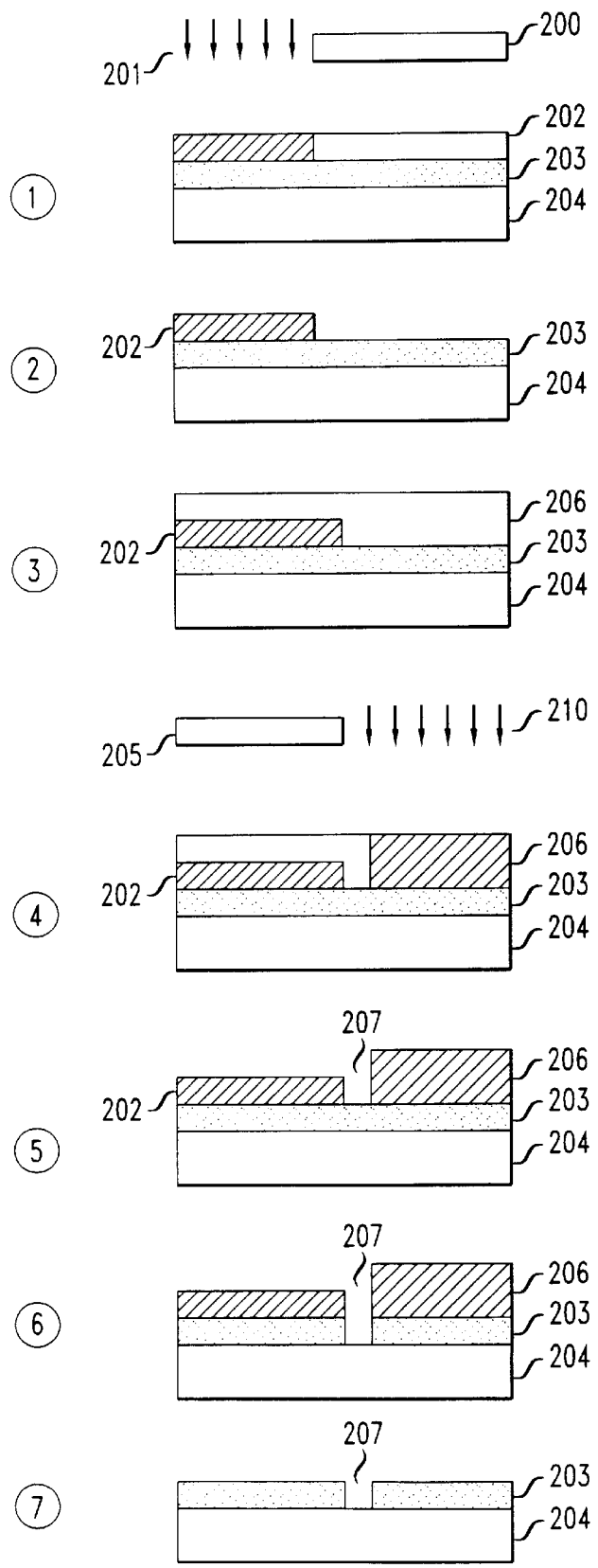
FIG. 3 is a schematic illustration of a third process sequence of the present invention.

Referring to FIG. 3, a negative resist material is used in the process of the present invention. When a negative resist is patternwise exposed to radiation and the image is developed, the exposed portion of the resist remains and the unexposed portion of the resist is developed out. In step 1, radiation 201 is projected through a mask 200. The radiation introduces an image of a pattern in energy sensitive resist layer 202, which is formed over a second layer of 203, which is formed on a silicon substrate 204. The second layer 203 is typically a dielectric layer. In this embodiment, layer 203 does not function as a hard mask. Therefore, the criteria for selecting the specific material for layer 203 are determined by the device being fabricated. In step 2, the pattern is then developed in energy sensitive resist layer 202. In step 3, a layer of energy sensitive material 206 is then formed on the resulting structure. In step 4, radiation 210 is projected through mask 205 and the patterned radiation introduces an image of a pattern in energy sensitive resist layer 206. In step 5, the pattern is then developed in energy sensitive resist layer 206. The solvent that is used to develop the pattern in step 5 selectively dissolves the unexposed portion of layer 206 does not dissolve the underlying patterned resist layer 202. The choice of a particular solvent for the selective development of resist layer 206 that will not dissolve underlying patterned resist layer 202 is readily made by one skilled in the art. Specifically, if a first solvent is selected to develop the pattern 206, the polarity of patterned layer 202 will have a polarity such that it is not soluble in the first solvent. One skilled in the art is aware of suitable resist materials and suitable solvents for this embodiment of the present invention. A description of solvents for selective development and optical, dual layer resists is found in Moreau, W. M., et al., *Semiconductor Lithography Principles, Practices, and Materials*, p. 586 (1987) which is incorporated by reference herein. Note that the developed resist layers 202 and 206 define a space 207. This space 207 is the desired feature, which is transferred into the second layer 203 in step 6. In step 7, the developed resist layers 202 and 206 are removed. Again, although the dimensions of the patterns developed in steps 3 and 5 are greater than the wavelength of the exposing radiation, the dimensions of the feature 207 are less than the wavelength of the exposing radiation. It is in this manner that the process of the present invention is used to fabricate features that have a dimension smaller than the wavelength of the exposing radiation.

Figure 4:
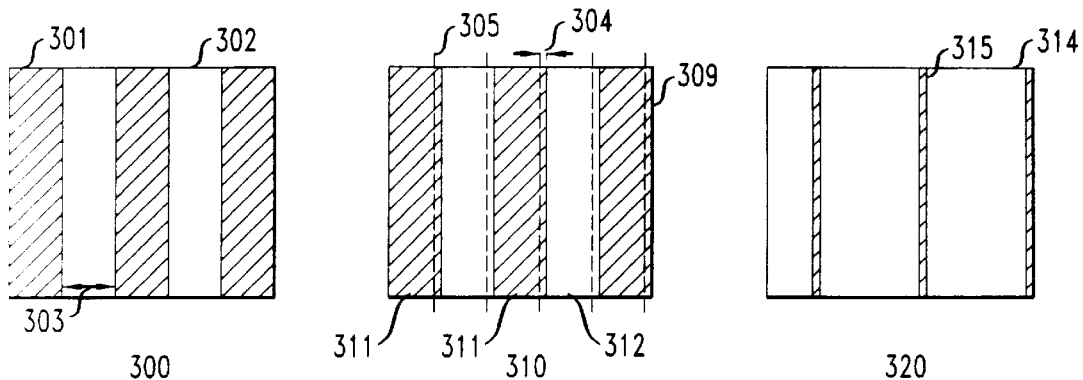
FIG. 4 illustrates a first mask pattern, a second mask pattern, and a feature formed therefrom.

One skilled in the art will appreciate that many different patterns are possible using the overlapping patterns of the present invention. One example of a pattern is illustrated in FIG. 4. In FIG. 4, a first pattern 300 is developed in a resist and transferred into a layer of silicon dioxide as described in steps 1–3 of FIG. 1. The pattern 300 is obtained by projecting radiation through a first mask (not shown) that defines a series of lines and spaces. The radiation projected through the mask defines an image of the mask pattern in the energy sensitive resist. That image is then developed using a developer to selectively remove the portion of the resist that was exposed to radiation. The developed pattern in the energy sensitive resist is then transferred into the underlying layer of oxidized silicon 301. The result is a first pattern that is a series of lines 301 on a silicon substrate. In the top view of the pattern illustrated in FIG. 4, the regions 301 are the regions of silicon oxide and the regions 302 are the substrate surface.

A layer of energy sensitive resist 309 is formed over the pattern. An image of a pattern is delineated in the energy sensitive resist. That image 310 is of a series of lines and spaces defined by regions 311, which are exposed to radiation, and regions 312, which are not exposed to radiation. That image is introduced into the energy sensitive resist by projecting radiation through a mask that defines a series of lines and spaces and onto the layer of energy sensitive resist. The relationship between the image 310 in the energy sensitive resist layer 309 and the underlying pattern 300 is illustrated by dashed lines 305. That relationship is such that the edge of exposed region 311 extends beyond edge of the underlying line 301. The distance 304 that the edge of exposed region 311 extends beyond the edge of underlying line 301 is the width of the desired feature. The width of the desired feature is less than the wavelength of the exposing radiation. In one example, the wavelength of the exposing radiation is 248 nm and the distance 304 is 50 nm.

After the image 310 is defined in the energy sensitive resist 309, the pattern is developed by removing the exposed portion 311 of the energy sensitive resist material. The dashed lines 305 indicate the edge of the underlying lines 301. The distance 304 is the portion of the underlying substrate that is exposed between the remaining portion of layer 309 and the oxidized silicon lines 301. The remaining portion of layer 309 and the lines of oxidized silicon 301 serve as an etch mask for transferring a trench having width 304 into the underlying substrate. The oxidized silicon lines 301 and the remaining portion of resist layer 309 are then stripped from the surface of the substrate. A top view of the resulting pattern 320, i.e. a substrate 314 with trenches 315 formed therein is provided in FIG. 4. The oxidized silicon lines 301 and the difference between the edge of the exposed portion 311 in the overlying layer of photoresist and the edge of the underlying line 311. The desired pattern 320, is the region defined by the distance between the edge of the first features 301 from the first mask and the edge of the resist features 311 in the second pattern 310.

Figure 5:
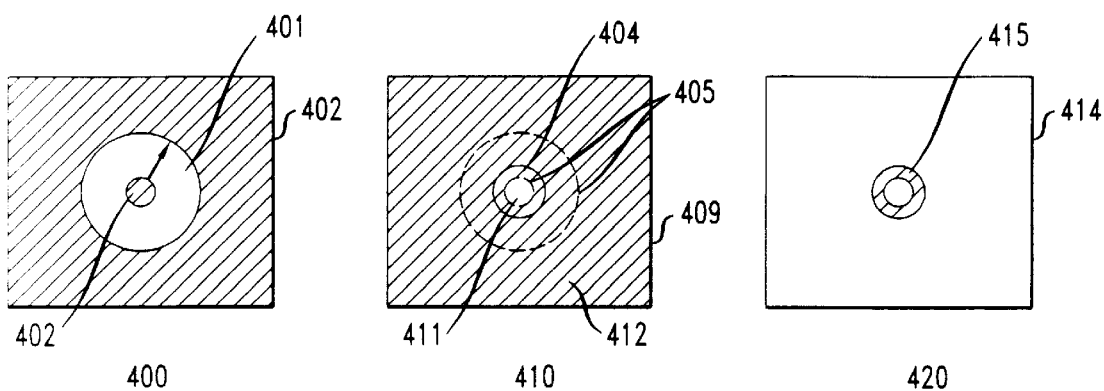
FIG. 5 illustrates two mask patterns and a feature formed therefrom.

Another example of a pattern formed using the process of the present invention is illustrated in FIG. 5. In FIG. 5, a first pattern 400 is developed in a resist and transferred into a layer of oxidized silicon as described in steps 1–3 of FIG. 2. The pattern 400 is obtained by projecting radiation through a first mask (not shown) that defines a ring. The radiation projected through the mask defines an image of the mask pattern in the energy sensitive resist. That image is then developed using a developer to selectively remove the portion of the resist that was exposed to radiation. The developed pattern in the energy sensitive resist is then transferred into the underlying layer of oxidized silicon 401. The result is a first pattern 400 that is a ring of oxidized silicon 401 on a silicon substrate 402. In the top view of the pattern illustrated in FIG. 5, the region 401 is the region of silicon oxide and the regions 402 are the exposed substrate surface.

A layer of energy sensitive resist 409 is formed over the ring pattern 400. An image of a pattern is delineated in the energy sensitive resist. That image 410 is of a circle defined by region 411, which is not exposed to radiation, and region 412, which is exposed to radiation. That image is introduced into the energy sensitive resist by projecting radiation through a mask that defines a circle and onto the layer of energy sensitive resist. The relationship between the image 410 in the energy sensitive resist layer 409 and the underlying pattern 400 is illustrated by dashed lines 405. That relationship is such that the inner edge of the ring is within and concentric with the unexposed circular region 412. The distance 404 between the edge of the inner ring of the pattern 400 and the outer edge of the unexposed, circular region 411 is the width of the desired feature. The width of the desired feature is less than the wavelength of the exposing radiation. In one example, the wavelength of the exposing radiation is 248 nm and the distance 404 is 50 nm.

After the image 410 is defined in the energy sensitive resist 409, the pattern is developed by removing the exposed portion 411 of the energy sensitive resist material. The dashed lines 405 indicate the edges of the underlying ring pattern 400. The distance 404 is the portion of the underlying oxidized silicon ring that is covered by the unexposed portion of the energy sensitive resist material 411 after the exposed portion of the energy sensitive resist material 412, along with the portion of the oxidized silicon ring underlying it, is removed. Referring to step 6 of FIG. 2, the remaining portion of the oxidized silicon ring corresponds, in side view, to the oxidized silicon 107. The remaining portion of energy sensitive resist layer 409 is then removed. The resulting pattern 420 is a ring of oxidized silicon 415 formed on a silicon substrate 414.

Figure 6:
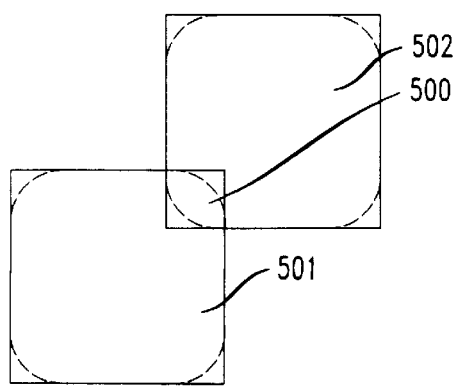
FIG. 6 illustrates two square mask patterns and a roughly elliptical contact hole pattern formed therefrom.

Contact holes with a dimension smaller than the wavelength of the exposing radiation are also produced using the process of the present invention. Contact holes are produced by creating a first intermediate pattern that is a rectangle or square. As one skilled in the art is aware, the pattern that results from an image with square corners has corners that are somewhat rounded. After the first pattern with rounded corners is developed, a layer of energy sensitive material is formed over the pattern and the image of a second square or rectangle is formed therein. The image of the second square or rectangle is positioned such that one corner overlaps one corner of the underlying pattern with rounded corners. The image of the second square or rectangle is then developed and it, too, has rounded corners. The pattern defined by the overlapping portion of the first pattern and the second pattern is then developed. Since this pattern is created from overlapping patterns of rounded corners, the resulting pattern is defined by two rounded corners. Consequently, the resulting pattern approximates an ellipse or a circle. The resulting pattern 500, as defined by overlapping corners of rectangles 501 and 502, is illustrated in FIG. 6. The roughly elliptical pattern, 500, is defined by dashed lines.

EXAMPLE 1

A set of four binary reticles (masks) was obtained from Dupont Photomask Inc. The masks were made using a laser tool and defined numerous different patterns. Two examples of the numerous patterns are depicted in FIG. 4 and FIG. 5. The reticle address space (i.e. the size of the addressable units (pixels) in the mask) was 40 nm. The smallest features on the mask had a dimension of 1 $\mu$m. The mask had a registration specification of 60 nm. The patterns in two of the four masks are the negative of the patterns in the other two masks so that different combinations of dark-field and bright field illumination and positive and negative photoresists were used. An XLS 7800 lithographic exposure tool was used for exposure. Ultratech Stepper, Inc manufactured the tool. The tool had a magnification of 4×, used an exposure wavelength of 248 nm, had a σ coherence factor of 0.74 and had a NA (numerical aperture) of 0.53. The positive energy sensitive resist (photoresist hereinafter) used for these examples was UV6™ which was obtained from the Shipley Company of Marlborough, Mass. The negative photoresist used for these examples was UV2™ which was also obtained from the Shipley Company.

Numerous mask patterns were used to create a variety of structures having a variety of configurations. One such mask pattern is the line and space pattern used to create the pattern 300 in FIG. 4. The lines and spaces were 0.25 $\mu$m wide. Another example of two masks that cooperate to provide a desired pattern are the masks used to create ring pattern 400 and circle pattern 410. The pattern that results from the use of the two masks in the process described in FIG. 2 and the accompanying text is the pattern 420.

A 1000-angstrom thick layer of oxidized silicon was deposited on silicon wafers. A layer of UV6™ energy sensitive resist was spin-coated over the layer of oxidized silicon. The spin-coated resist had a thickness of 680 nm. The photoresist was then pre-baked at 138° C. for sixty seconds.

Following the sequence described in FIG. 2, the positive photoresist was patternwise exposed to radiation using the previously described line-and-space mask. The lines and spaces in the image delineated in the photoresist had an individual width of 0.25 $\mu$m and a length of 1 $\mu$m. The dose of radiation introduced into the photoresist was 40 mJ/cm². The pattern was then subjected to a post-exposure bake at a temperature of 130° C. for 90 seconds. The pattern was developed using a conventional developer, tetramethylammonium hydroxide (TMAH) in combination with developer 262 (obtained from the Olin Microelectronics, Inc.). The developer was applied as a stream onto the wafer for about 15 seconds. After about 45 seconds, the wafer was rinsed and dried. The pattern was then transferred into the underlying layer of silicon oxide using an Applied Materials' 5000 Magnetron etch.

The pattern was etched at 33° C. using 65 sccm (standard cubic centimeter per minute) of trifluoromethane and 3 sccm of hexafluorosilane for 25 seconds. The pattern was then further etched using a mixture of 30 sccm trifluoromethane, 60 sccm argon and 4 sccm tetrafluoromethane for twenty seconds. The resist remaining after the etch was stripped in an oxygen plasma at 250° C. for ninety seconds.

A layer of photoresist (the previously described UV6™ positive resist) was then applied over the resulting structure. The photoresist had a thickness of 700 nm. The resist thickness was selected to ensure that portions of the substrate underlying the unexposed resist were not exposed to the etchant. The thickness was determined based upon the difference between the etch rate of the exposed and unexposed resist, and the etch rate of the unexposed resist. The photoresist was then exposed to radiation by projecting a 40 mJ/cm² dose of radiation using the mask that provides the pattern 310 illustrated in FIG. 4. Registration of the image with the previous pattern was accomplished by using standard alignment techniques. In this example, the mask pattern used for the second exposure is the same as the mask pattern for the first exposure. However, the second exposure was offset relative to the underlying pattern that was produces from the first exposure. The offset distance corresponded to the desired feature size. In this example, numerous patterns were fabricated. Different offsets were used to make different patterns. The offset of the image produced from the second exposure relative to the first pattern was varied from 0.05 $\mu$m to about 0.2 $\mu$m.

The pattern was then developed as previously described in this Example. The resulting structure is a patterned photoresist layer and a patterned silicon dioxide layer on the substrate. As illustrated in step 5 of FIG. 1, the desired pattern is the portion of the substrate surface that is not covered by either the oxidized silicon mask or the photoresist mask. The pattern is transferred into the underlying substrate by selectively etching the exposed portion of the substrate surface, wherein the pattern oxidized silicon and remaining photoresist function as an etch mask. The etch expedients used for this pattern transfer step were hexafluoroethane (90 sccm) and oxygen plasma (10 sccm) for twenty-five seconds at 33° C. The remaining photoresist and oxidized silicon were stripped from the substrate surface using expedients well known to one skilled in the art.

The resulting patterns were a series of lines and spaces. For all patterns, the line length was 1 $\mu$m. The width of the lines varied from 0.05 $\mu$m to 0.2 $\mu$m for the patterns. As previously noted, the linewidth was determined by the offset distance between the pattern that resulted from the first exposure and the image (and resulting developed pattern) that was obtained from the second exposure.

In the process of the present invention, the second mask must be registered with the first pattern from the first exposure in order to obtain a correspondence between the position of the first pattern and the position of the second pattern. Positional correspondence is required in order to obtain the desire pattern. The registration error (i.e. the difference between a desired position and an actual position) is less than about 30 nm. In the wafer coordinate system, the intersection of the x-axis and y-axis is approximately located in the center of the wafer. Thus, in the wafer coordinate system, the wafer is divided into four quadrants. The mean registration error across a six-inch wafer was −28 nm (with a $3\sigma_x$=96 nm) along the x-axis and 6 nm (with a $3\sigma_y$=89 nm)

along the y-axis. Typically, current steppers print with a mean-plus-3σ of 40 nm.

The present invention has been described in terms of specific examples. These examples have been provided to illustrate certain embodiments of the claimed invention. For example, the present invention has been described in terms of a first exposure (using a first mask pattern) and a second exposure (using a second mask pattern). One skilled in the art will appreciate that the present invention will be practiced using two or more exposures. Also, the process of the present inventions is used to form any pattern. This is in addition to the specific patterns of line and spaces, rings and holes described herein by way of example. Consequently the examples are provided to illustrate the claimed invention and should not be construed to limit the present invention, except in a manner consistent with the appended claims.

What is claimed is:

1. A lithographic process for fabricating an article comprising:

directing radiation of a certain wavelength onto a mask having a first pattern therein;

projecting an image of the first pattern into a layer of energy sensitive material formed on a substrate;

developing the image to form the first pattern in the energy sensitive material;

forming a layer of energy sensitive resist material over the first pattern;

directing radiation of a certain wavelength onto a mask having a second pattern therein wherein the wavelength is either the same or different than the wavelength of the radiation directed onto the mask having the first pattern;

projecting an image of the second pattern into the layer of energy sensitive resist material wherein the image is aligned with the underlying first pattern so that the first pattern and the second pattern cooperate to define a desired pattern;

developing the image to form the second pattern in the energy sensitive material; and developing the desired pattern from the first and second pattern, wherein the desired pattern has a dimension that is smaller than at least one of the wavelengths of radiation.

2. The process of claim 1 wherein the article is a semiconductor device.

3. The process of claim 2 wherein the substrate is a semiconductor substrate on which is formed a layer of material wherein the material is selected from the group consisting of a hard mask material, a dielectric material and a metal.

4. The process of claim 3 wherein the energy sensitive material is a positive energy sensitive material.

5. The process of claim 4 further comprising transferring the developed first pattern into the layer of material formed on the semiconductor substrate.

6. The process of claim 5 wherein the first and second patterns have a thickness with edges orthogonal to the substrate surface and wherein the image of the second pattern is aligned with the first pattern such that there is a distance between an edge of the first pattern and an edge of the second pattern, wherein the desired pattern is defined by the distance and the distance is less than the wavelength of the exposing radiation.

7. The process of claim 6 wherein a portion of the underlying semiconductor substrate is exposed between the edge of the first pattern and the edge of the second pattern and further comprising transferring the desired pattern into the underlying substrate.

8. The process of claim 6 wherein a portion of the second pattern extends over a portion of the first pattern and further comprising transferring the desired pattern into the layer of material formed on the semiconductor substrate.

9. The process of claim 3 wherein the energy sensitive material is a negative energy sensitive material.

10. The process of claim 9 wherein the first and second patterns have a thickness with edges orthogonal to the substrate surface and wherein the image of the second pattern is aligned with the first pattern such that there is a distance between an edge of the first pattern and the edge of the second pattern, wherein the desired pattern is defined by the distance and the distance is less than the wavelength of the exposing radiation.

11. The process of claim 10 wherein a portion of the layer of material formed on the substrate is exposed between the edge of the first pattern and the edge of the second pattern and further comprising transferring the desired pattern into the layer of material formed on the substrate.

12. The process of claim 1 wherein the article is a lithographic mask.

* * * * *